United States Patent
Luo et al.

(10) Patent No.: US 11,930,590 B2
(45) Date of Patent: Mar. 12, 2024

(54) STRESS RELIEF FOR FLIP-CHIP PACKAGED DEVICES

(71) Applicant: Texas Instruments Incorporated, Dallas, TX (US)

(72) Inventors: Tianyi Luo, Allen, TX (US); Osvaldo Jorge Lopez, Annandale, NJ (US); Jonathan Almeria Noquil, Plano, TX (US); Satyendra Singh Chauhan, Murphy, TX (US); Bernardo Gallegos, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 106 days.

(21) Appl. No.: 17/218,792

(22) Filed: Mar. 31, 2021

(65) Prior Publication Data

US 2022/0210911 A1 Jun. 30, 2022

Related U.S. Application Data

(60) Provisional application No. 63/132,910, filed on Dec. 31, 2020.

(51) Int. Cl.
| | |
|---|---|
| *H05K 1/02* | (2006.01) |
| *H01L 21/50* | (2006.01) |
| *H01L 23/00* | (2006.01) |
| *H01L 23/538* | (2006.01) |
| *H01L 21/60* | (2006.01) |

(52) U.S. Cl.
CPC .......... *H05K 1/0271* (2013.01); *H01L 21/50* (2013.01); *H01L 23/5385* (2013.01); *H01L 23/5386* (2013.01); *H01L 24/14* (2013.01); *H01L 2021/60097* (2013.01); *H01L 2224/16225* (2013.01)

(58) Field of Classification Search
CPC ....... H05K 1/0271; H01L 24/14; H01L 21/50; H01L 23/5385; H01L 23/5386
USPC ...................................................... 257/737
See application file for complete search history.

(56) References Cited

U.S. PATENT DOCUMENTS

| | | | |
|---|---|---|---|
| 2011/0076809 A1* | 3/2011 | Pendse | H01L 24/32 257/737 |
| 2013/0299961 A1* | 11/2013 | Chen | H01L 23/49827 257/706 |
| 2015/0286318 A1* | 10/2015 | Morein | G06F 3/0446 345/174 |
| 2017/0110389 A1* | 4/2017 | Hayashi | H01L 23/49541 |

\* cited by examiner

*Primary Examiner* — Quoc D Hoang
(74) *Attorney, Agent, or Firm* — Dawn Jos; Frank D. Cimino

(57) ABSTRACT

In a described example, an apparatus includes: a package substrate having a planar die mount surface; recesses extending into the planar die mount surface; and a semiconductor device die flip chip mounted to the package substrate on the planar die mount surface, the semiconductor device die having post connects having proximate ends on bond pads on an active surface of the semiconductor device die, and extending to distal ends away from the semiconductor device die having solder bumps, wherein the solder bumps form solder joints to the package substrate within the recesses.

12 Claims, 11 Drawing Sheets

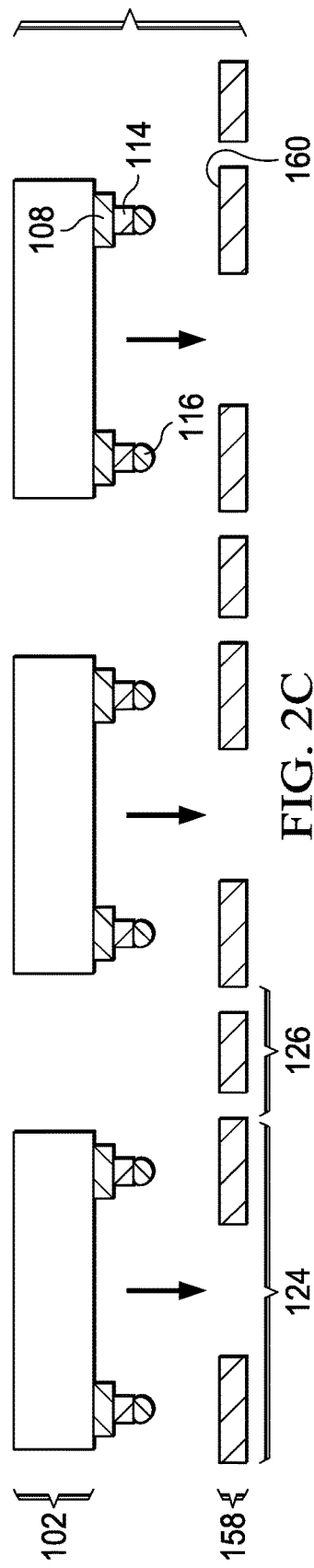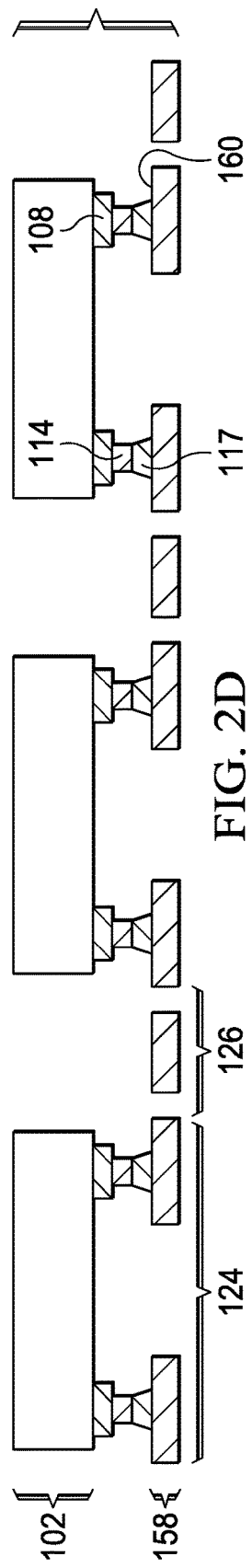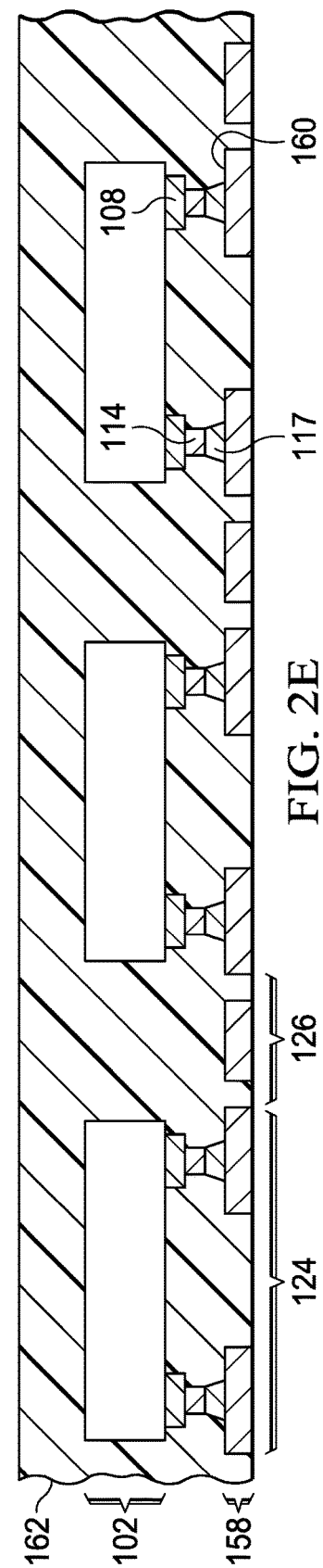

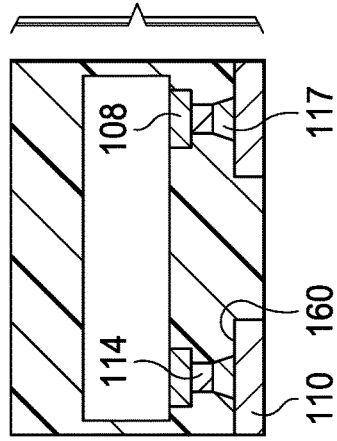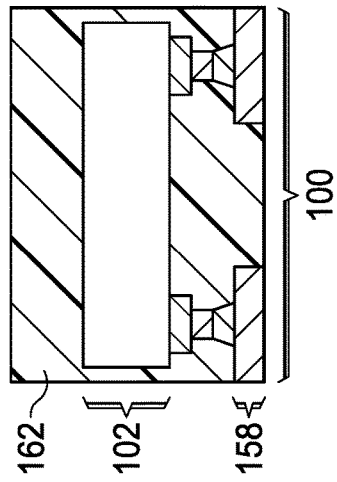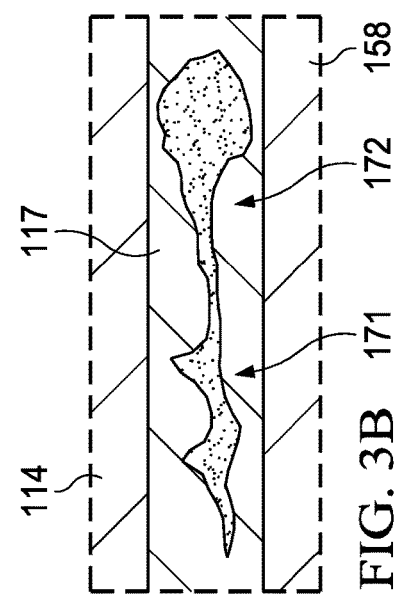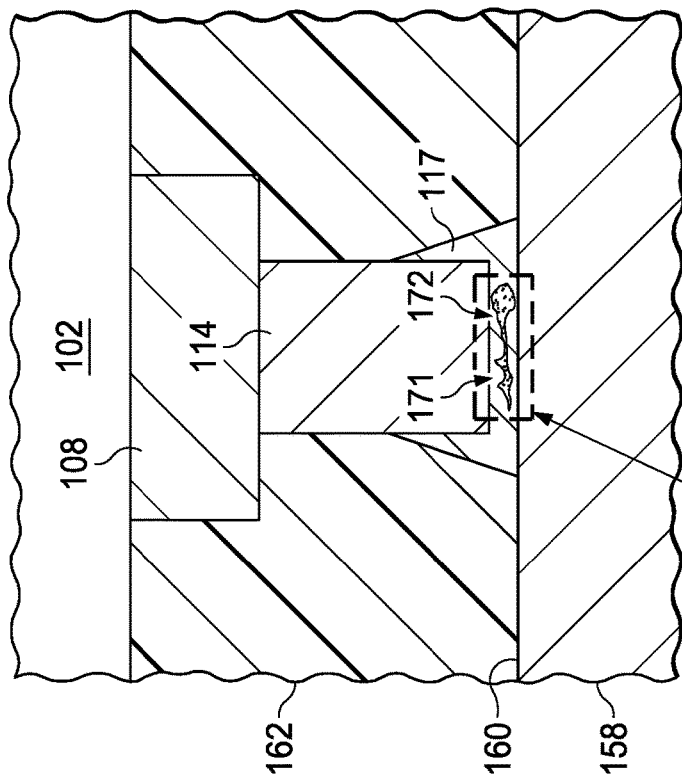

STRESS RELIEF FOR FLIP-CHIP PACKAGED DEVICES

CROSS-REFERENCE TO RELATED APPLICATIONS

This application claims the benefit of and priority to U.S. Provisional Application No. 63/132,910, filed Dec. 31, 2020, which is hereby incorporated herein by reference in its entirety.

TECHNICAL FIELD

This relates generally to packaging electronic devices, and more particularly to flip chip packaged devices.

BACKGROUND

Processes for producing packaged electronic devices include mounting the electronic devices to a package substrate, and then covering the electronic devices with mold compounds in a molding process to form packages. The molding processes may be done on multiple electronic devices simultaneously. The devices may be arranged in a strip of devices adjacent to one another, or in a two dimensional array of devices in rows and columns on a package substrate. Once the packages are complete, the devices are separated from one another. In one method to separate the devices from one another, a saw is used. The saw cuts through the mold compound and through the package substrate materials along saw streets defined between the electronic devices, to cut through the materials and separate the devices. Other cutting tools such as lasers can be used.

When devices are mounted on package substrates using flip-chip packages, a semiconductor device die has conductive post connects that extend from a proximal end placed on bond pads on an active surface of the semiconductor device die to a distal end having a solder ball or solder bump. In a flip-chip package the semiconductor device die is mounted with the active surface facing the package substrate. When the semiconductor device die is flip-chip mounted to the package substrate, the solder bumps at the distal end of the post connects are heated and allowed to reflow to form solder joints that provide a mechanical connection and electrically couple the semiconductor device die to the package substrate. The solder joints mount the conductive post connects to a conductive area on the package substrate. To ensure component level reliability (CLR), the flip-chip packaged electronic devices are stress tested. In the stress tests, repeated temperature cycling is performed from a rated minimum temperature to a rated maximum temperature. Due to the use of materials in the packages with different coefficients of thermal expansion (CTE), including semiconductor substrates, package substrates, solder and mold compound, the materials expand and contract at different rates. Failures can occur in the solder joints due to the mechanical stress and strain placed on the solder joints. The stress is due in part to the mold compound that applies mechanical stress to the solder joints. Failures in solder joints during stress testing causes scrapping of packaged electronic devices.

SUMMARY

In a described example, an apparatus includes: a package substrate having a planar die mount surface; recesses extending into the planar die mount surface; and a semiconductor device die flip chip mounted to the package substrate on the planar die mount surface, the semiconductor device die having post connects having proximate ends on bond pads on an active surface of the semiconductor device die, and extending to distal ends away from the semiconductor device die having solder bumps, wherein the solder bumps form solder joints to the package substrate within the recesses.

BRIEF DESCRIPTION OF THE DRAWINGS

FIGS. 2A-2F illustrate in projection views and cross-sectional views major steps in manufacturing a flip chip packaged electronic device.

FIGS. 3A-3B illustrates in a cross sectional view a solder joint failure in a flip chip packaged device, and a close up cross sectional view of the solder joint, respectively.

DETAILED DESCRIPTION

Figure 1:
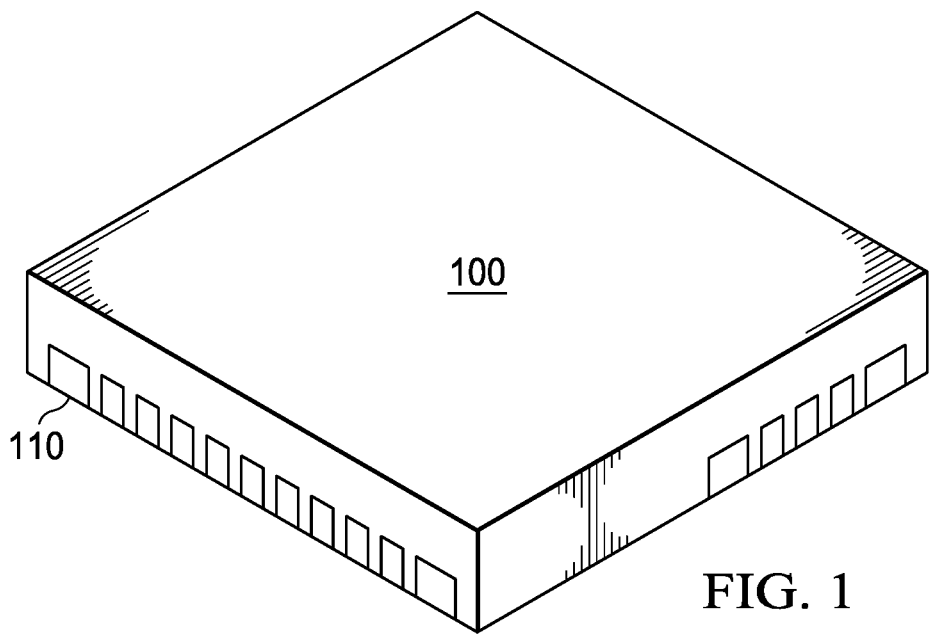
FIG. 1 is a projection view of a flip chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "packaged electronic device" is used herein. A packaged electronic device has at least one semiconductor die electronically coupled to terminals and has a package body that protects and covers the semiconductor device die. In some arrangements, multiple semiconductor dies can be packaged together. For example, a power metal oxide semiconductor (MOS) field effect transistor (FET) semiconductor device die and a logic semiconductor device die (such as a gate driver die or controller device die) can be packaged together to from a single packaged electronic device. Additional components such as passives can be included in the packaged electronic device. The semiconductor device die is mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor device die can be flip-chip mounted with the active surface facing the substrate surface, and the semiconductor device die mounted to the leads of the substrate by conductive post connects carrying solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. In one example, a MIS package substrate useful in the arrangements is referred to as a "routable lead frame" or "RLF." These package substrates can include dielectrics such as liquid crystal polymer (LCP) or mold compound, and can include one or more layers of conductive portions in the dielectrics. Repeated plating and patterning can form multiple layers of conductors spaced by dielectrics, and conductive vias connecting the conductor layers through the dielectrics, the dielectrics can be mold compound. The package substrate can include lead frames, and can include plated, stamped and partially etched lead frames. In a partially etched lead frame, two levels of metal can be formed by etching a pattern from one side of a metal substrate configured for lead frames, and then etching from the other side, to form full thickness and partial thickness portions, and in some areas, all of the metal can be etched through to form openings through the partial etch lead frames. The package substrate can also be tape-based and film-based, and these can form substrates carrying conductors. Ceramic substrates, laminate substrates with multiple layers of conductors and insulator layers; and printed circuit board substrates of ceramic, fiberglass or resin, or glass reinforced epoxy substrates such as FR4 can be used as the package substrates.

The term "post connect" is used herein. As used herein, a post connect is a structure made of a conductive material, for example copper or copper alloys, gold or gold alloys, or combinations of conductive metal that provides a connection between a semiconductor die and a package substrate. A proximate end of the post connect is mounted to a bond pad on the active surface of a semiconductor die, while a distal end of the post connect is extended away from the bond pad of the semiconductor die. When the packaged semiconductor device is oriented with the semiconductor die positioned above and facing a die mount surface of a package substrate in a flip-chip orientation, the post connect makes a vertical connection between a conductive portion of the package substrate and the bond pad of the semiconductor die. Some references describe a type of post connect as a "controlled collapse chip connection" or as "C4" bumps. The conductive post connect includes a post of conductor material and a solder bump or ball at the distal end facing away from the surface of the bond pad on the semiconductor device die, where a proximal end of the post connect is mounted to the bond pad. The conductive material remains intact after the solder bump is melted during a solder reflow process, the conductive material controlling the vertical spacing or controlling the "collapse" of the post connect structure during solder reflow.

A package substrate, such as a lead frame, MIS, or PMLF substrate, will have conductive portions on a die side surface. Leads of a metal lead frame are conductive all along the surfaces, while for other substrate types, conductive lands in dielectric substrate material are arranged and aligned to electrically and mechanically connect to the conductive post connects. The post connects can extend along the same direction as a conductive lead in the package substrate, so that it appears as a rail or rectangle. Solder will be formed at the distal end of the post connect. When the post connect is copper and is pillar shaped and solder bumped at the end, it may be referred to as a "copper pillar bump." A copper pillar bump or copper bump is therefore an example of a post connect. In addition to the pillar shape, the post connect can also be a column, rectangle or rail shape, and can have an oval, round, square or rectangular cross section. In examples, multiple post connects can be arranged in parallel to one another with additional post connects coupled to a common trace on a package substrate, to provide a low resistance path between the semiconductor die and the package substrate. The post connects can also transfer thermal energy away from the semiconductor die to a package substrate and out of the package. The solder at the ends of the post connects is used in a thermal reflow process to make a solder joint. The solder joint provides both a mechanical attachment and an electrical connection between the semiconductor die and the package substrate. Post connects are used to form several, tens, hundreds or thousands of connections between a semiconductor die and a substrate in fine pitch semiconductor packages. In a discrete device or power transistor package, only a few post connects may be used. The conductive post connects can be, in some examples, a uniform size and have uniform or minimum pitch between them. In other examples, the size of the post connects can be made larger for power terminals or for high current signals, and smaller for control signals or logic signals that require less current, and may have varying spacing distances. Multiple post connects can be coupled in parallel to reduce resistance for certain signals, such as a high current signal, power or ground signal. Pot connects can vary in size and shape, but in examples range from 10-70 microns in diameter, and may range from 20-50 microns in height from the bond pad surface on the semiconductor die. The solder ball or bump may have a height from 5-15 microns, so that the total height of the post connect and bump may range from 25-65 microns. As device sizes continue to fall and the density of connections rises, these sizes may decrease.

In packaging semiconductor devices, a mold compound may be used to partially cover a package substrate, to cover the semiconductor die, and to cover the connections from the semiconductor die to the package substrate. This "encapsulation" process is often a compressive molding process, where thermoset mold compound such as resin epoxy can be used. A room temperature solid or powder mold compound can be heated to a liquid state and then molding can be performed. Transfer molding can be used. Unit molds shaped to surround an individual device may be used, or block molding may be used, to form the packages simultaneously for several devices from mold compound. The devices can be provided in an array of several, hundreds or even thousands of devices in rows and columns that are molded together. After the molding, the individual packaged devices are cut from each other in a sawing operation by cutting through the mold compound and package substrate in saw streets formed between the devices. Portions of the package substrate leads are exposed from the mold compound package to form terminals for the packaged semiconductor device. Flip chip mounted devices can be used. In flip chip mounting, solder balls, solder columns, or solder bumps are formed on the conductive post connects. The post connects are formed extending from bond pads of the semiconductor die. The semiconductor die is then oriented with the solder bumps at the distal ends of the post connects facing a die mounting surface of a circuit board or substrate. A solder reflow process is used to attach the solder bumps to the conductive die pads or leads on the package substrate, the solder forming a physical attachment and an electrical connection between the package substrate and the semiconductor die. Mold compound or other protective dielectric material can cover the die and a portion of the package substrate to complete the flip chip package.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and so the saw will traverse the molded electronic devices in two different directions to cut apart the packaged electronic devices from one another in the array.

The term "quad flat no-lead" or "QFN" is used herein for a type of electronic device package. A QFN package has conductive leads that are coextensive with the sides of a molded package body and the leads are on four sides. Alternative flat no-lead packages may have leads on two sides or only on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A small outline package or SOP can be used with the arrangements.

In the arrangements, a package substrate has stress relief structures formed in correspondence with at least some of the post connects on a semiconductor device die. The package substrate has conductor portions that are configured to receive a solder joint formed between a post connect of a semiconductor device die and the package substrate. The stress relief structures in some example arrangements surround the solder joint. In other arrangements, the stress relief structures can wholly or partially surround the solder joint, or can be formed along one or more sides of a position on the package substrate proximate to where a solder joint is formed. The stress relief structures reduce or eliminate the thermal mechanical stresses that the solder joint is subjected to from the thermal expansion and contraction of the materials, including the mold compound and the package substrate. The mold compound has an interface with the package substrate on the die mount surface of the package substrate, surrounding the solder joint and a portion of the post connect. The stress relief structures provide stress buffers that reduce mechanical stress on the solder joints. Reliability is increased and solder joint failures in accelerated stress testing is reduced by use of the arrangements.

In an arrangement for a flip chip packaged semiconductor device using a lead frame as a package substrate, the lead frame has a planar surface on a die mount side. Stress relief structures are formed in correspondence to portions of the lead frame that are configured for forming solder joints with the post connects of a semiconductor die. The stress relief structures are recesses formed extending into the lead frame from the surface of the lead frame on the die mount side. The recesses have bottoms that are at a plane that is below the planar surface of the lead frame. The recesses correspond to solder joint positions on the package substrate, and solder joints formed between post connects of a semiconductor die mounted to the package substrate and the leads of the lead frame are formed within the recesses. Mold compound is formed over the semiconductor die and covering the planar surface of the die mount side of the package substrate, and surrounding the post connects. The material interface between the mold compound and the surface of the package substrate is in a different plane than the solder joint between the conductive post connect and the lead, which is within the recess on the package substrate. Stress on the solder joints due to thermal expansion and thermal contraction of the materials is reduced by the use of the stress relief structures.

In an alternative arrangement, a MIS substrate is formed using plated conductor layers in a dielectric material with vias between the layers. In an example, the MIS substrate has multiple plated layers spaced by mold compound, the mold compound layers holding conductive traces with vias coupling layers vertically through the mold compound. Conductive portions of the MIS substrate are configured to receive the solder joints between the conductive post connects extending from a semiconductor die mounted as a flip chip and the package substrate. The solder joint positions are at least partially surrounded by plated protrusions on the die side surface of the package substrate, which form stress relief structures. In some examples, the solder joint positions are completely surrounded by the protrusions on the die side surface of the package substrate. After the solder joints are formed, a molding process is performed. Mold compound is formed on the die side surface of the MIS substrate, covering the semiconductor device die, the protrusions, and surrounding the conductive post connects. The solder joints are protected from thermal mechanical stress due to thermal expansion and contraction of the mold compound by the stress relief structures, which are placed either completely around or partially around the solder joints. Alternatively, protrusions are placed around or partially around the solder joints for selected solder joints. The solder joints selected are those at locations where the highest thermal mechanical stress is expected to occur. Reliability is increased and solder joint failure is reduced or eliminated by use of the arrangements.

FIG. 1 illustrates a packaged electronic device 100 in a quad flat no lead (QFN) package. The packaged electronic device has a body formed from a thermoset mold compound, such as epoxy resin. Other mold compounds, such as resins, epoxies, or plastics can be used. Leads 110 are part of a package substrate that supports a semiconductor die (not visible in FIG. 1, as it is obscured by the package body) within the package, the leads 110 are exposed from the mold compound and form electrical terminals for the packaged electronic device. The packaged electronic device 100 can be mounted to a circuit board using surface mount technology (SMT). Package sizes for packaged electronic devices are continually decreasing, and currently can be several millimeters on a side to less than one millimeter on a side, although larger and smaller sizes are also used. Future package sizes may be smaller.

Figure 2B:
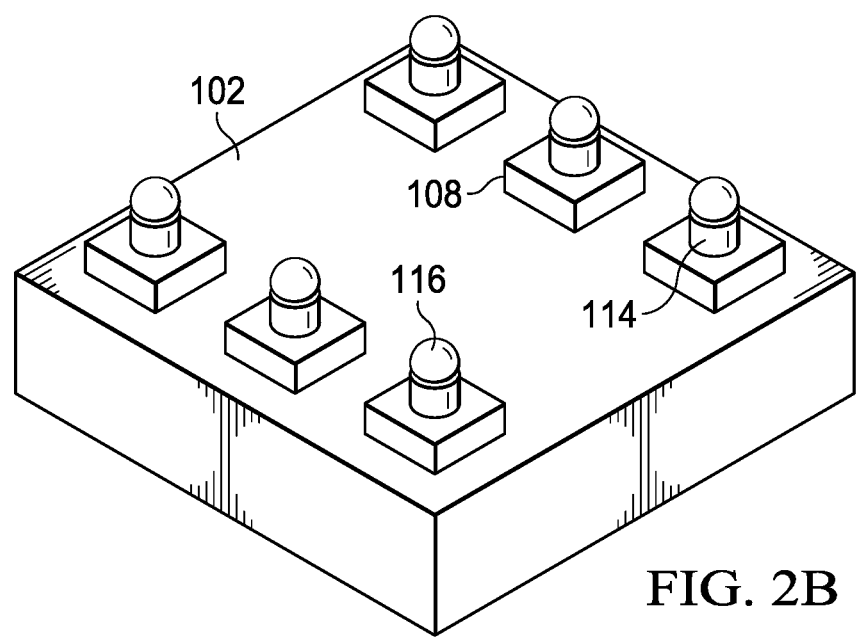
Figure 2A:
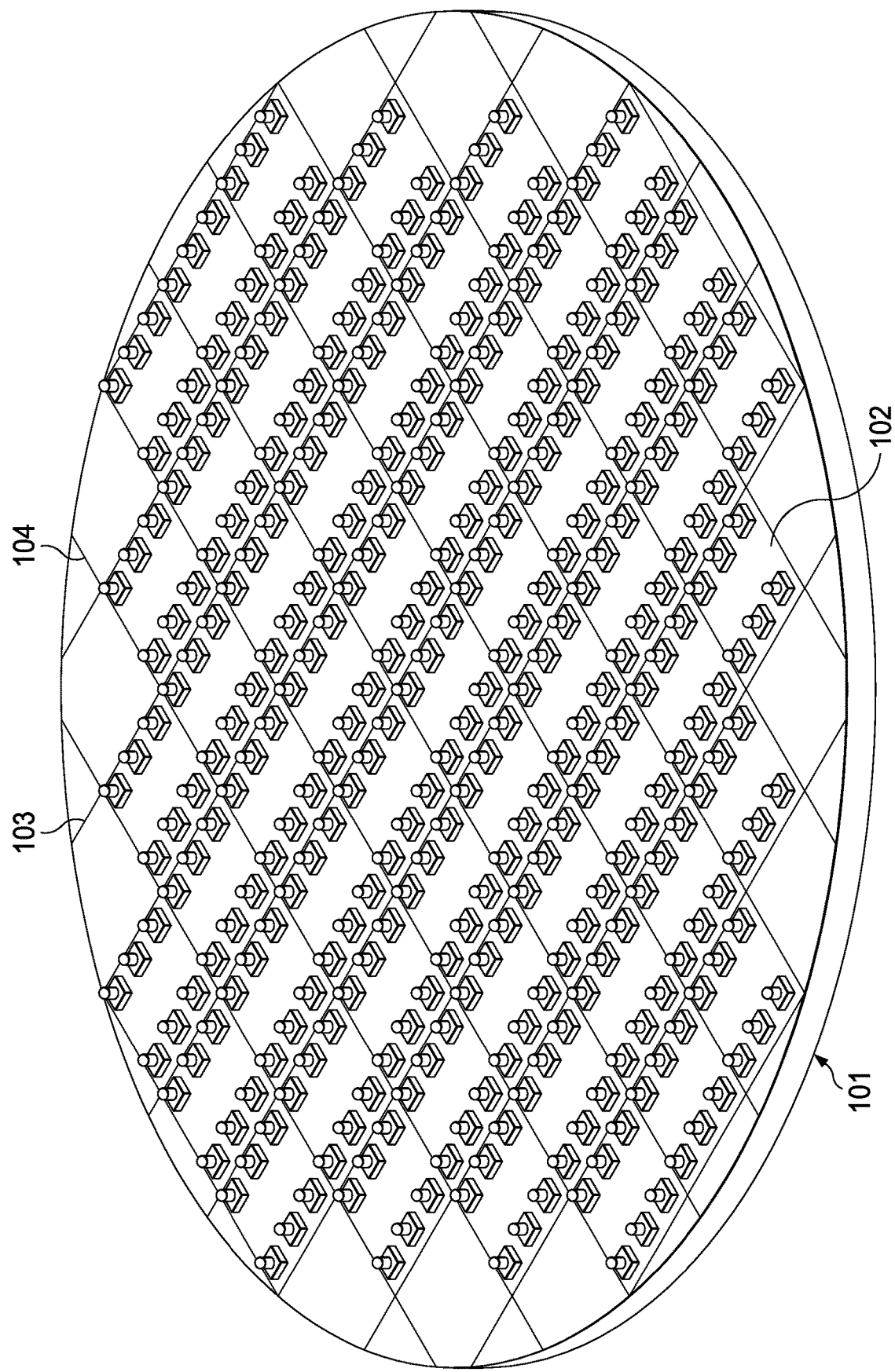

FIGS. 2A-2F illustrate in a series of steps a method for forming packaged electronic devices. In FIG. 2A, a semiconductor wafer 101 is shown with an array of semiconductor device dies 102 in rows and columns formed on an active surface. The semiconductor device dies 102 are formed using processes in a semiconductor manufacturing facility, including ion implant doping, anneal, oxidation, dielectric and metal deposition, photolithography, pattern, etch, chemical mechanical polishing (CMP), electroplating, and other processes for making semiconductor devices. Vertical and horizontal (as the wafer is oriented in FIG. 2A) scribe lines 103 and 104, which are perpendicular to one another and which run in parallel groups across the wafer, separate the rows and columns of the completed semiconductor device dies, and provide areas for dicing the wafer to separate the semiconductor device dies 102 from one another.

FIG. 2B illustrates a single semiconductor device die 102, with bond pads 108, which are conductive pads that are electrically coupled to devices formed in the semiconductor device die 102. Conductive post connects 114 are shown extending away from a proximate end mounted on the bond pads 108 on the active surface of semiconductor device die 102, and solder bumps 116 are formed on the distal ends of the conductive post connects 114. The conductive post connects can be formed by electroless or electroplating. In an example, the conductive post connects are copper pillar bumps. Copper pillar bumps can be formed by sputtering a seed layer over the surface of the semiconductor wafer 101, forming a photoresist layer over the seed layer, using photolithography to expose the bond pads 108 in openings in the layer of photoresist, plating the copper conducive post connects 114 on the bond pads, and plating a lead solder or a lead-free solder such as an SnAg or SnAgCu solder to form solder bumps 116 on the copper conductive post connects 114. Other conductive materials can be used for the conductive post connects in an electroplating or electroless plating operation, including silver (Ag), nickel, palladium, nickel palladium, tin, for example. The photoresist is then stripped, and the excess seed layer is etched from the surface of the wafer. The semiconductor device dies are then separated by dicing, or are singulated, using the scribe lines 103, 104 (see FIG. 2A).

FIG. 2C shows in a cross sectional view semiconductor device dies 102 after the semiconductor device dies 102 have been singulated from the semiconductor wafer 101 with bond pads 108, post connects 114 and solder bumps 116. The semiconductor device dies 102 are flip-chip oriented, facing a die mounting surface 160 of a package substrate 158. In the illustrated example, the package substrate 158 is a conductive lead frame. Each unit lead frame 124 in a strip or array is spaced from an adjacent unit lead frame by a saw street 126. The lead frames have a conductive surface and may include plated areas (not shown) to receive the solder bumps, or the solder bumps may be soldered directly to the lead frame surface in designated positions. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold) that are used to improve solderability and reduce diffusion can be used at the solder joint positions.

In FIG. 2D, a cross sectional view shows the singulated dies 102 after mounting on the die pads 160 on the conductive lead frame by solder joints 117 formed using solder bumps 116 (see FIG. 2C) on the conductive post connects 114. A thermal reflow process may be used to melt the solder bumps 116 and form the solder joints between the post connects 114 and the package substrate 158. The solder joints 117 provide both mechanical attachment and electrical connection between the semiconductor device die 102 and the package substrate 158.

FIG. 2E is another cross sectional view that shows the semiconductor device dies 102 with bond pads 108, conductive post connects 114 and solder joints 117 after an encapsulation molding process covers the devices and portions of the package substrate 158 with a mold compound 162. The dies 102, the solder joints 117, the conductive post connects 114, and portions of the package substrate 158 are shown covered with a mold compound 162. The mold compound 162 may be a filled resin epoxy. The mold compound 162 can be subjected to a thermal cure or can be a thermoset mold compound, heated to liquefy it, and dispensed in a transfer mold as a heated liquid that cures and solidifies as it cools. Other mold compounds and materials such as plastics, resins, or epoxies can be used. Saw streets 126 separate the molded devices from each other between unit lead frames 124.

In FIG. 2F, a cross sectional view shows individual packaged semiconductor device dies 100 after the devices have been singulated one from one another by cutting through the saw streets 126 on the package substrate 158. Each packaged semiconductor device 100 has a package body of mold compound 162, leads 110 that are partially covered by the mold compound 160 and with portions exposed from the mold compound 162 to form terminals for the packaged semiconductor device.

FIGS. 3A and 3B illustrate in a cross sectional view and a close up view, respectively, example solder joints 117 formed between a post connect 114 on a bond pad 108 of a semiconductor die 102 and a package substrate 158. Areas 171, 172 show failures in the solder joints such as those due to thermal and mechanical stress. In FIG. 3A, solder joint 117 is shown between a post connect 114 and a package substrate 158. Conductive post connect 114 extends away from bond pad 108 on the active surface of semiconductor device die 102. Areas 171 and 172 are cracks or failures in the solder joint 117. FIG. 3B illustrates cracks 171 and 172 in the solder joint 117 in a close up view. These figures illustrate example solder joint failures such as have been observed in packaged flip-chip devices due to mechanical stress during CLR accelerated stress testing.

Figure 4A:
FIGS. 4A-4E illustrate in cross sectional views steps in manufacturing an arrangement for a flip chip packaged electronic device.

FIGS. 4A-4E illustrating steps for making an arrangement in a series of cross section views. FIG. 4A illustrates a package substrate 458. In this example the package substrate is a conductive leadframe, for example a copper leadframe. The copper leadframe may be plated with layers of materials to prevent tarnish, reduce copper ion diffusion, and increase solderability. Example plating layers include gold, nickel, palladium, platinum, electroless nickel, immersion gold, electroless palladium, and combinations like ENIG (electroless nickel immersion gold) and ENEPIG (electroless nickel, electroless palladium, immersion gold). In FIG. 4A, areas 461, 463 are configured to receive a corresponding solder bump on a post connect for a flip-chip mounted semiconductor device die will be placed. The die mount surface 460 is a planar surface where mold compound will cover the package substrate in the following steps.

Figure 4B:

In FIG. 4B, the package substrate of FIG. 4A is shown after stress relief structures are formed. In this example, the stress relief structures are recesses 465, 467 formed extending into the lead frame from the planar die mount surface 460. The bottoms of the recesses 465, 467 are rounded in this example, in alternative arrangements the bottoms can be flat, for example when the recesses are formed using laser drilling. The recesses 465, 467 are formed in correspondence with the solder joint position areas 461, 463 and will receive the solder on a conductive post connect in the process steps that follow. The bottom of the recesses 465, 467, where solder joints will form, are in a plane 461 which is spaced from the planar die mount surface 460 by a distance "D". The distance "D" varies but will correspond to the size of the solder bumps, and will be sufficiently large that a solder joint formed in the recess is largely contained within the recess, and may range from 2-10 microns depending on the size of the solder bumps. The recesses 465, 467 extend to a sufficient depth from the planar surface 460 that the solder in the solder joints to be made will be within the recesses 465, 467 as shown in FIG. 4D, below.

Figure 4C:
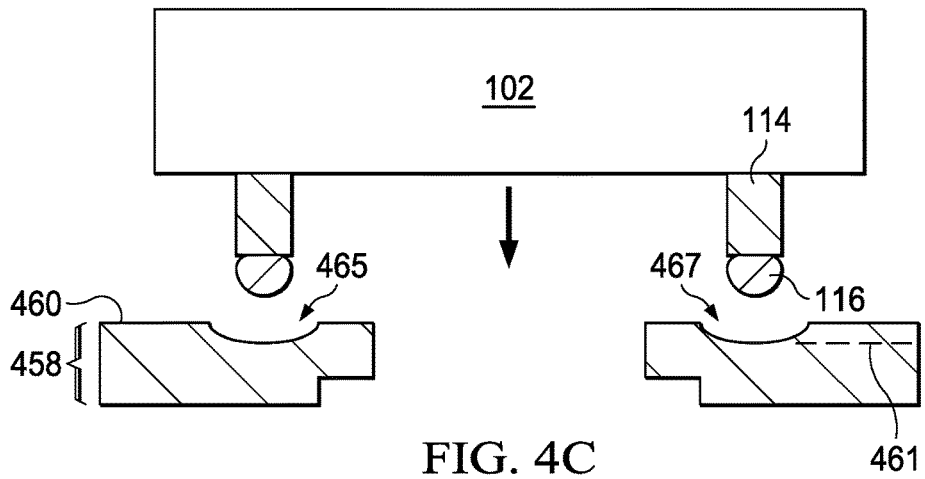

FIG. 4C illustrates in a cross sectional view a semiconductor device die 102 positioned in a flip-chip orientation with post connects 114 and solder bumps 116 positioned over the package substrate 458, and aligned to be flip chip mounted using the solder bumps 116, which will be placed in recesses 465, 467.

Figure 4D:
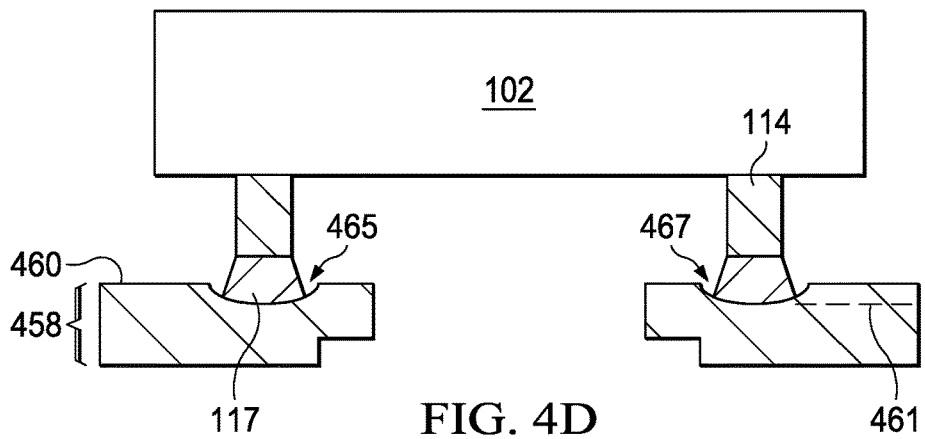

FIG. 4D illustrates in a cross sectional view the semiconductor die 102 after a die mounting operation, the solder bumps 116 are subjected to a thermal reflow process that melts the solder and forms solder joints 117 in recesses 465, 467. The solder joints 117 contact the leads of the lead frame of package substrate 458 in plane 461, spaced from the planar die mount surface 460 by the depth of the recesses 465, 467, which is sufficient depth so that the solder joint 117 is within the recesses 465, 467. The recesses have sufficient diameter to allow the distal end of the post connects 114 to extend below the die mount surface 460.

Figure 4E:
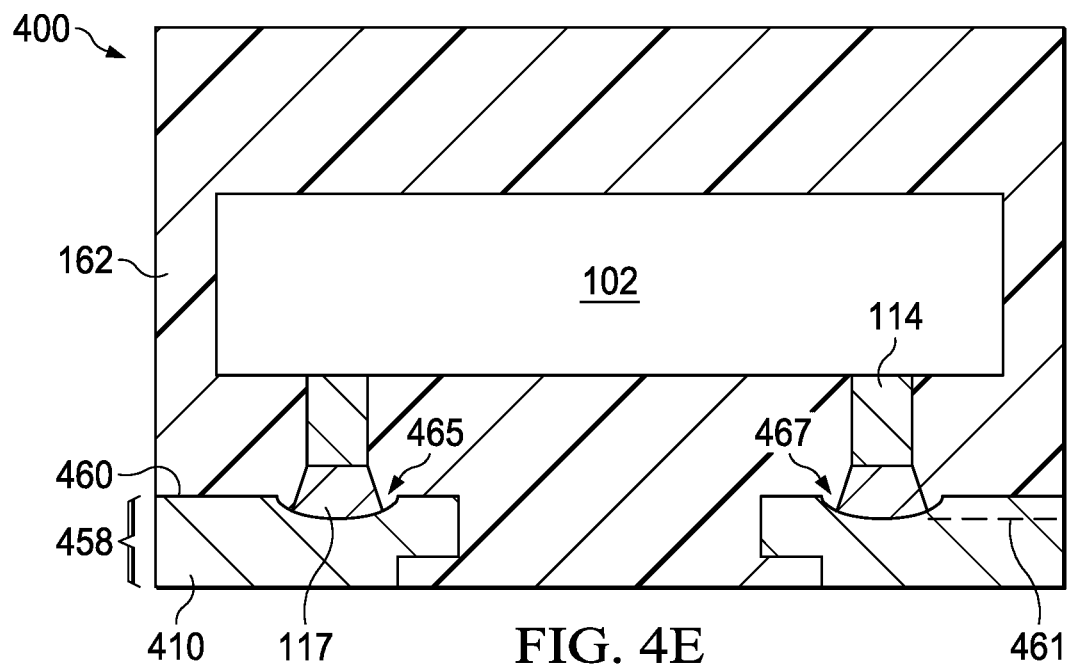

FIG. 4E illustrates in another cross sectional view a packaged semiconductor device 400 after mold compound 162 covers the semiconductor die 102, and surrounds the post connects 114 and the solder joints 117. The mold compound covers the die mount surface 460 and portions of the package substrate 458 while other portions of the package substrate 468 are left uncovered and form terminals or leads 410 for the packaged semiconductor device 400. The leads 410 can be used to surface mount the packaged semiconductor device 400 to a circuit board.

The solder joints 117 are protected from stress due to material expansion and contraction by the stress relief structures, recesses 465 and 467. Because the solder joints 117 in recesses 465, 467 are formed in a plane 461 that is spaced from the die mount surface 460 of the package substrate, the stress at the mold compound to lead frame interface at plane 460 is not placed on the solder joints, which are exposed to less mold compound stress in the plane 461. By spacing the solder joints 117 away from the material interface between the mold compound 162 and the die mount surface 460 of the lead frame (package substrate 458), solder joint failure from thermal mechanical stress is reduced or eliminated.

Figure 5:
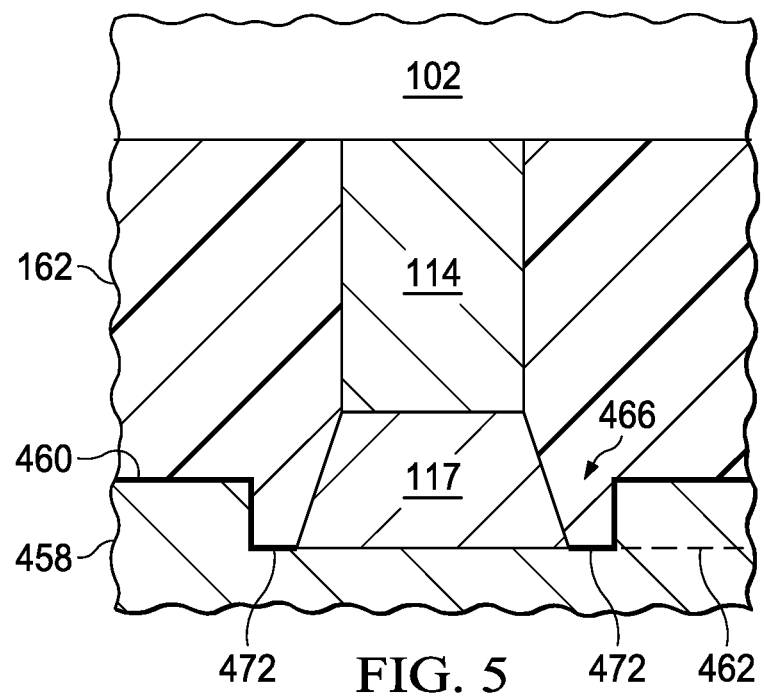
FIG. 5 illustrates in a close-up cross sectional view a conductive post interconnect in an arrangement showing features of the flip chip packaged device.

FIG. 5 is a cross sectional view of a solder joint for an alternative arrangement. In FIG. 5, a package substrate 458, here a conductive lead frame, is shown with a stress relief structure, here a recess 466, extending into the lead frame from the die mount surface 460. The recess 466 has a flat bottom surface at plane 462, which is formed by laser drilling for example. A solder joint 117 is formed in the recess 466 using solder reflow on a solder bump. The mold compound 162 is shown covering the die mount surface 460 of the package substrate, and surrounding the post connect 114 and solder bumps 116. In FIG. 5, example mold compound delamination is shown, with a line 472 indicating that the mold compound 162 is not completely adhering to the surface of lead frame 458. When delamination occurs, the solder joints will be mechanically stressed as the materials move apart during thermal cycles. Because the solder joint 117 is in the recess, the stress from the mold compound on the solder joint is reduced (when compared to solder joints not formed in a recess), so the recess of the arrangements provides stress relief.

FIGS. 6A-6E illustrate, in a series of cross sectional and projection views, steps of a method for making an alternative arrangement. In these figures, a molded interconnect substrate (MIS) is used as the package substrate 658 for a flip-chip packaged electronic device. In FIG. 7A, the package substrate 658 has a planar die mount surface 660. Traces 601 are exposed from a dielectric, such as a LCP or mold compound, and form conductive areas for making solder joint connections to a semiconductor device die. Vias 602 couple to the trace layer 601 and make a vertical electrical path into the MIS substrate 658. A second trace layer 603 is shown within the MIS substrate, and a final via layer 604 extends to a board side surface 661 of the MIS substrate.

Figure 6A:
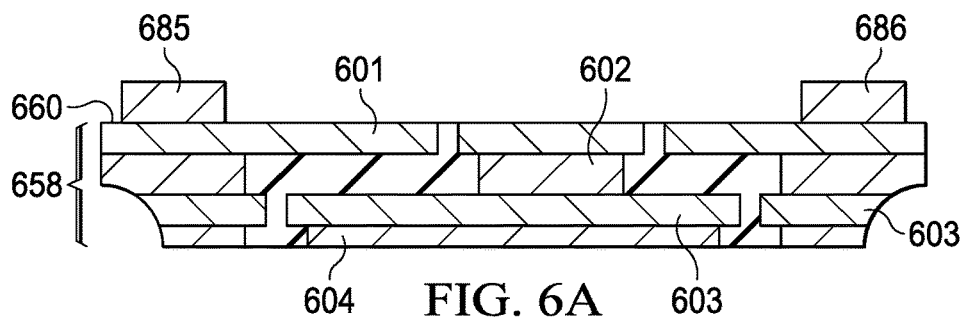
FIGS. 6A-6E illustrate, in a series of cross sectional and projection views, a method for making an alternative arrangement.
Figure 6B:
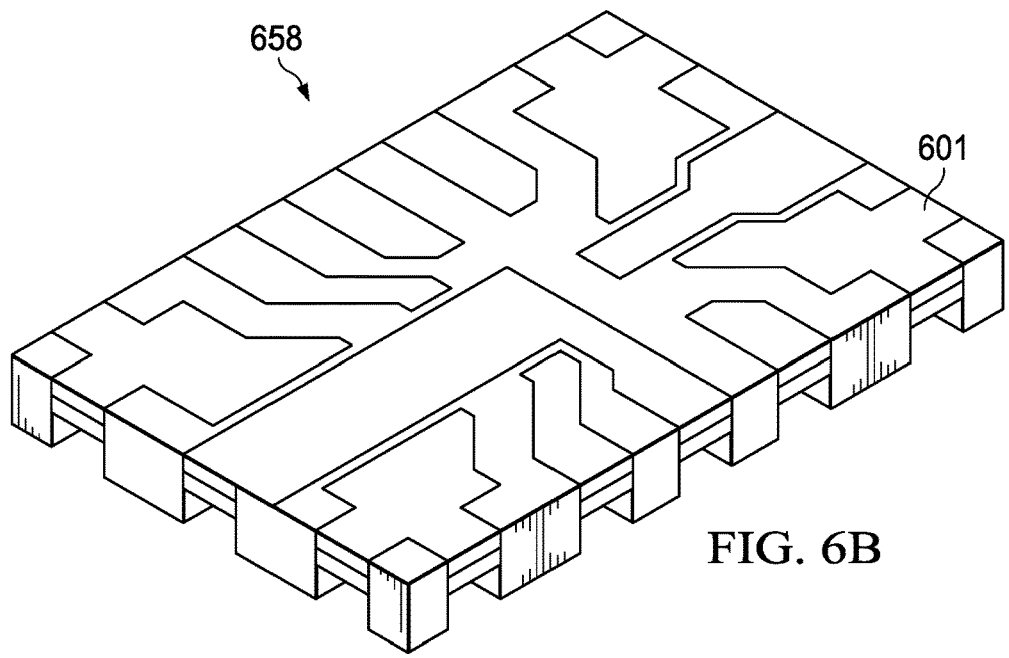
Figure 7A:
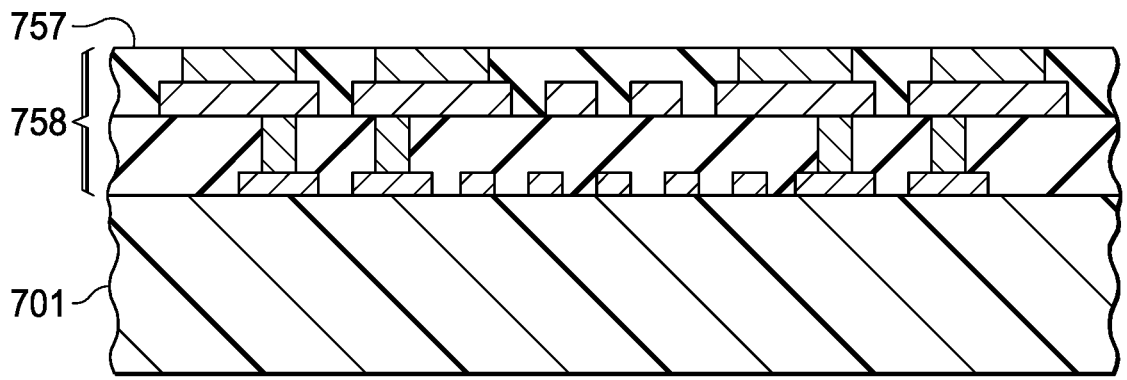
FIGS. 7A-7B illustrate cross sectional views showing steps for forming an additional arrangement.

In FIG. 6A, stress relief structures 685, 686 are shown on the die mounting surface 660 of the substrate 658. These stress relief structures are protrusions of material that are plated on the surface or adhered to the surface 660 to change the mold compound stress that will be applied to solder joints to be formed on the surface 660. The stress relief structures create a mold compound interface to the package substrate that lies on a different plane than the solder joint interface to the package substrate, when the package is later encapsulated in mold compound. FIG. 6B is a projection view of the MIS substrate 758 showing the traces 601.

Figure 6C:
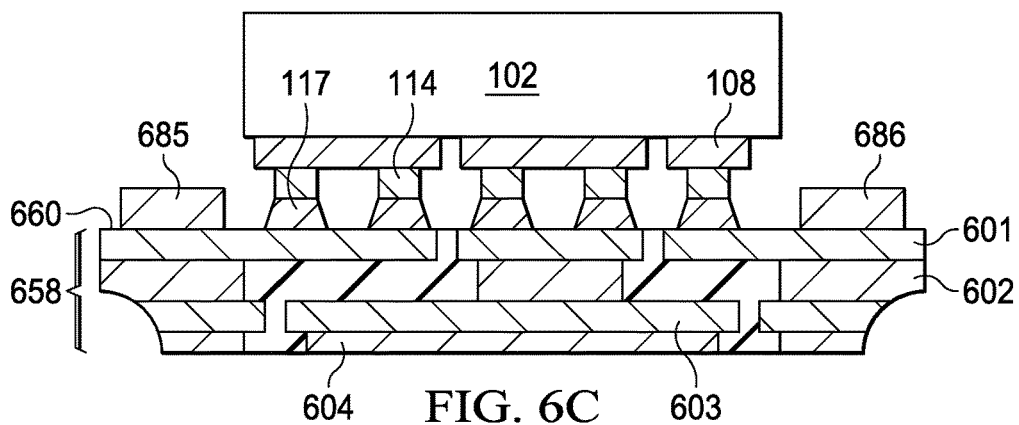
Figure 6D:
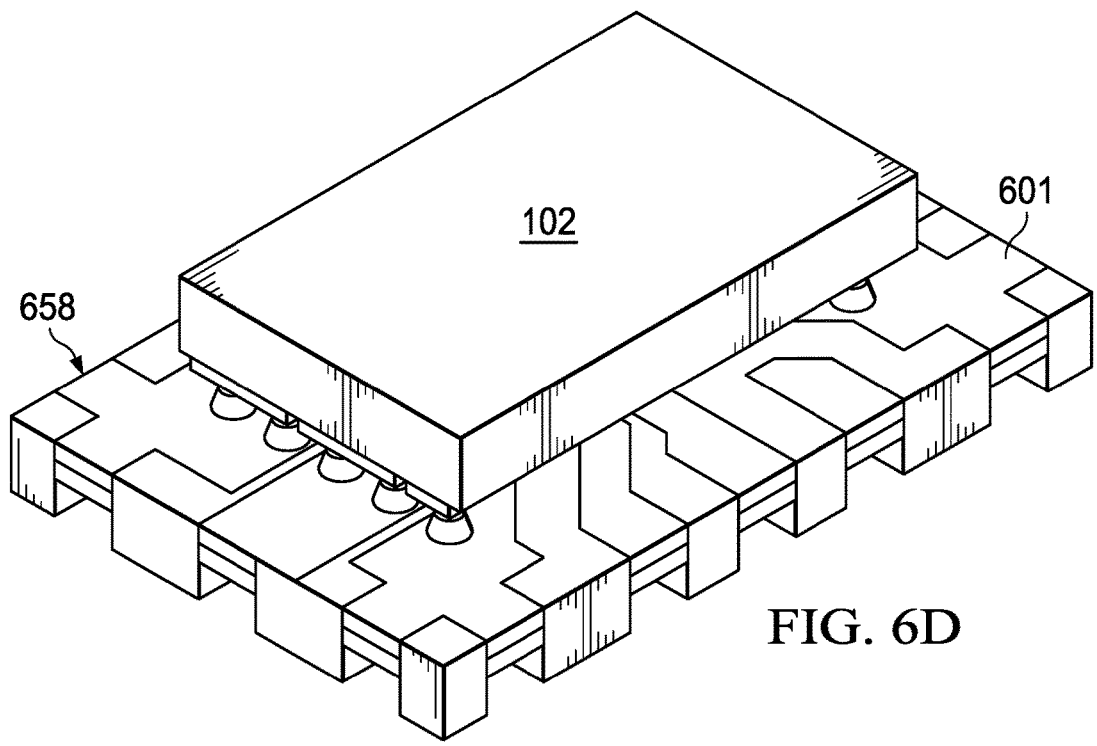

FIG. 6C illustrates the package substrate 658 after a semiconductor device die 102 is flip-chip mounted to the die mount surface 660. Solder bumps on post connects 114 are used to form solder joints 117 using thermal reflow to melt the solder bumps. Stress relief structure, protrusions 685, 686, are placed proximate to the solder joints in at least some locations on the package substrate 658 to reduce mechanical stress that the solder joints 117 will be subjected to. FIG. 6D is a projection view showing the semiconductor die 102 flip-chip mounted to the package substrate 658.

Figure 6E:
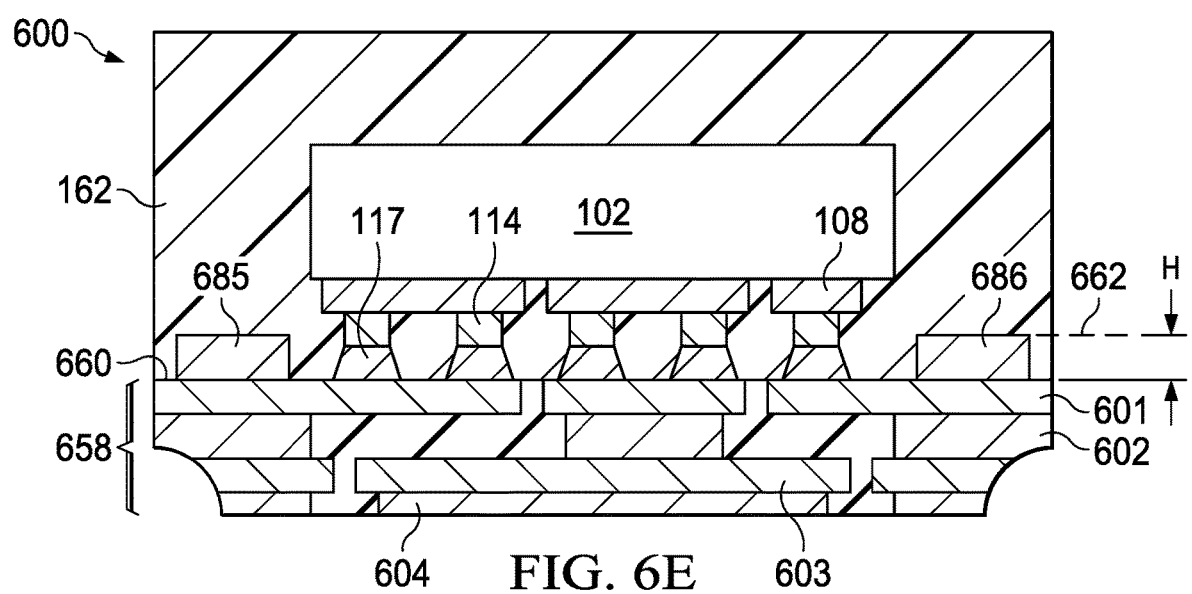

FIG. 6E illustrates in a cross sectional view a packaged electronic device 600 formed by encapsulation processes to cover the flip-chip mounted semiconductor device die 102 (see FIG. 6C) with a mold compound 162. The stress relief structures, protrusions 685, 686, are formed on the die mount surface 660 and have a planar upper surface in a plane 662 that has a height "H" above the die mounts surface 660. The height H will vary with size of the solder bumps used is sufficient to reduce the mechanical stress on the solder joints 117 due to the mold compound, and may range from 2-10 microns, increasing with an increased size of the solder bumps used, and decreasing when the solder bump size decreases. The mold compound 162 covers and forms a material interface to the die mount surface 660 of the package substrate 658, and to the upper surface of the protrusions 685, 686 in a plane 662 that is spaced from the die mount surface 660. The solder joints 117 between the post connects 114 and the die mount surface 660 of the package substrate 658 are protected from thermal mechanical stress due to the mold compound 162 by the protrusions 685, 686 that are placed near, or surrounding the solder joint locations. The protrusions are placed proximate to the solder joints that are to be protected, and within 50 microns of the solder joints, to reduce mechanical stress due to the mold compound. The solder joints 117 form an interface to the die mount surface of the package substrate 658 in a different plane than the mold compound material interface to the upper surface of the protrusions 685, 686.

Figure 7B:
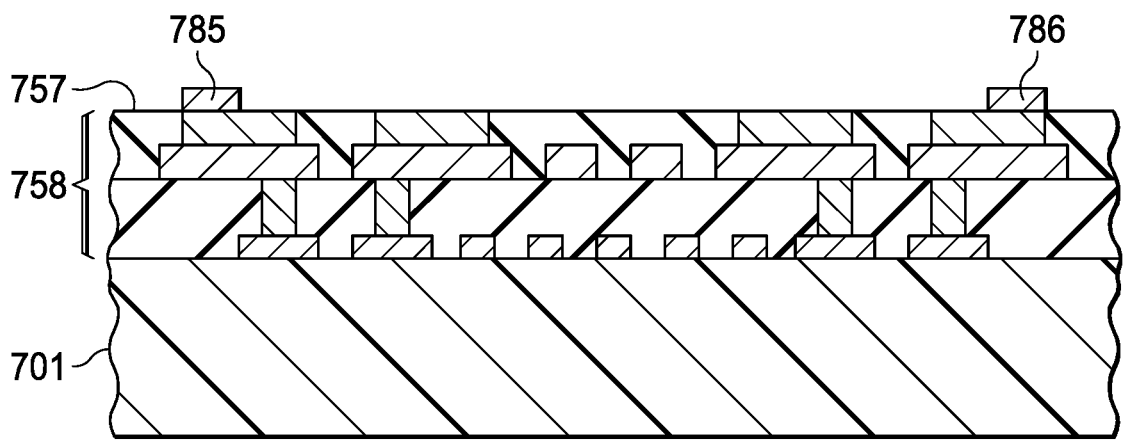

FIGS. 7A-7B illustrate in cross sectional views steps to form stress relief structures on a routable lead frame (RLF) package substrate. In FIG. 7A, a package substrate 758 is shown after a first and a second layer of conductors is plated and molded to form a RLF package substrate with two layers of conductors coupled with vertical vias. The substrate is on a carrier 701. The surface 757 of the substrate 758 is exposed by a grinding operation after the molding operations are completed.

In FIG. 7B, the RLF substrate 758 is shown after an additional plating step is used to form stress relief structure 785, 786 on the surface 757 of the RLF. As described above, these stress relief structures 785, 786 are proximal to areas on where solder joints will be formed when a flip-chip oriented semiconductor die is mounted to the substrate 758, and the stress relief structures 785, 786 reduce the mechanical stress on the solder joints due to the CTE mismatch between a mold compound covering the solder joints, the semiconductor die, and the substrate 758. The stress relief structure 785 786 can be formed proximate to particular solder joints in a package that are identified by simulation, or by experiments, as more prone to solder joint failure due to mechanical stress. Alternatively stress relief structures can be formed proximate to all the solder joints on a particular package substrate.

Figure 8A:
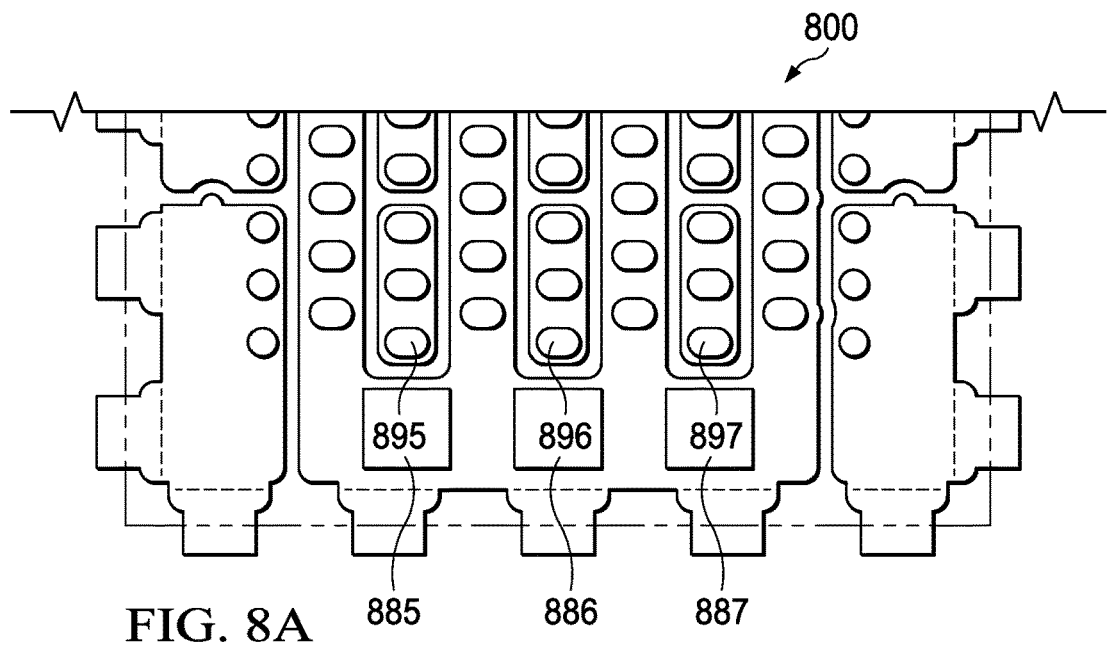
FIG. 8A is a plan view of an example package substrate of the arrangements.

FIG. 8A is a plan view of an example RLF substrate 800 having the stress relief structures, which are protrusions placed proximate to certain solder joint locations to reduce solder joint stress. In FIG. 8A, the protrusions 885, 886. 887 are placed near solder joint locations 895, 896, 897 on the substrate 800. When the conductive post connects are used with the solder bumps to flip chip mount a semiconductor device die that is then covered with mold compound to form a packaged electronic device, the solder joints in these locations will benefit from lowered mechanical stress due to the protrusions 85, 886, 887.

Figure 8B:
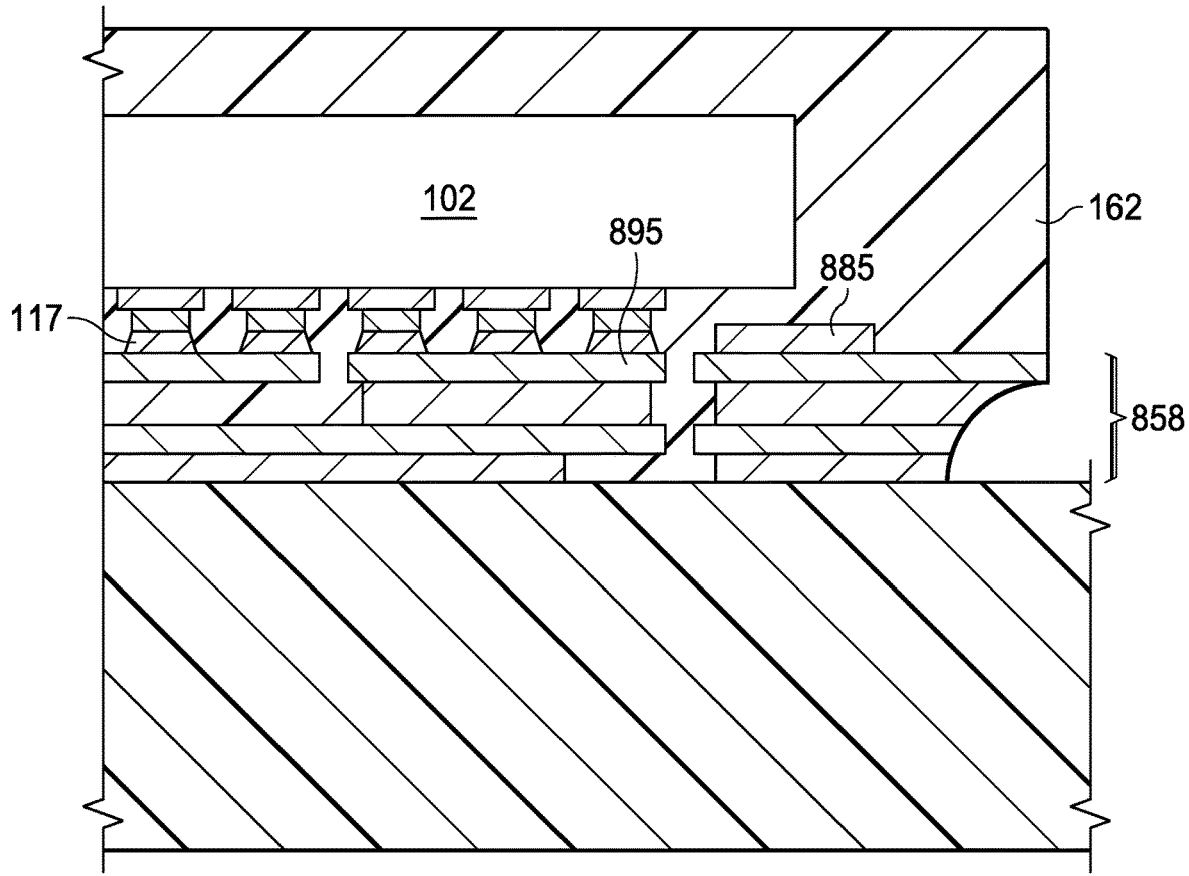
FIG. 8B is an illustration showing a cross section of a packaged semiconductor device.

FIG. 8B is a cross section of a packaged semiconductor device including a stress relief structure, protrusion 885, on a package substrate 858 proximate to a post connect at location 895. At location 895 a post connect is connected to the package substrate 858, in this example an RLF substrate, by a solder joint 117. Mold compound 162 covers the semiconductor die 102, the substrate 858, and surrounds the post connects and the solder joints 117. The protrusion 885 provides a stress buffer and reduces the stress on the solder joint 117 that connects the post connect 895 to the package substrate 858.

Figure 9:
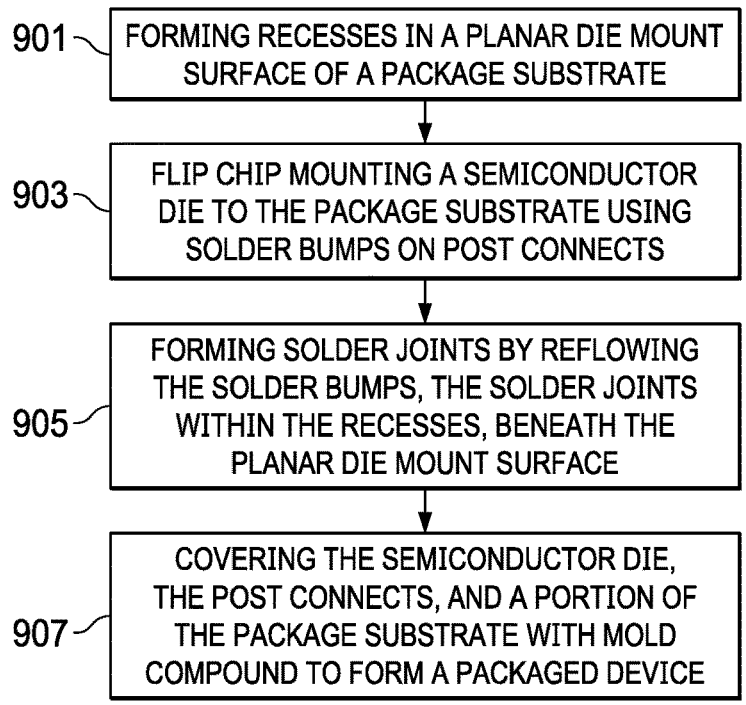
FIG. 9 is a flow diagram illustrating a method

FIG. 9 is a flow diagram illustrating a method. At step 901, recesses are formed at locations configured for receiving a solder joint in a planar surface on a die mounting surface of a package substrate, for example a conductive lead frame.

At step 903, a semiconductor die is flip chip mounted to the package substrate, the semiconductor die has post connects with solder bumps for mounting.

At step 905, the solder bumps are melted by a reflow process to form solder joints with the package substrate. The solder joints are formed within the recesses, and below the planar surface of the package substrate. At step 907, the semiconductor die, the package substrate and the post connects are covered with mold compound.

Figure 10:
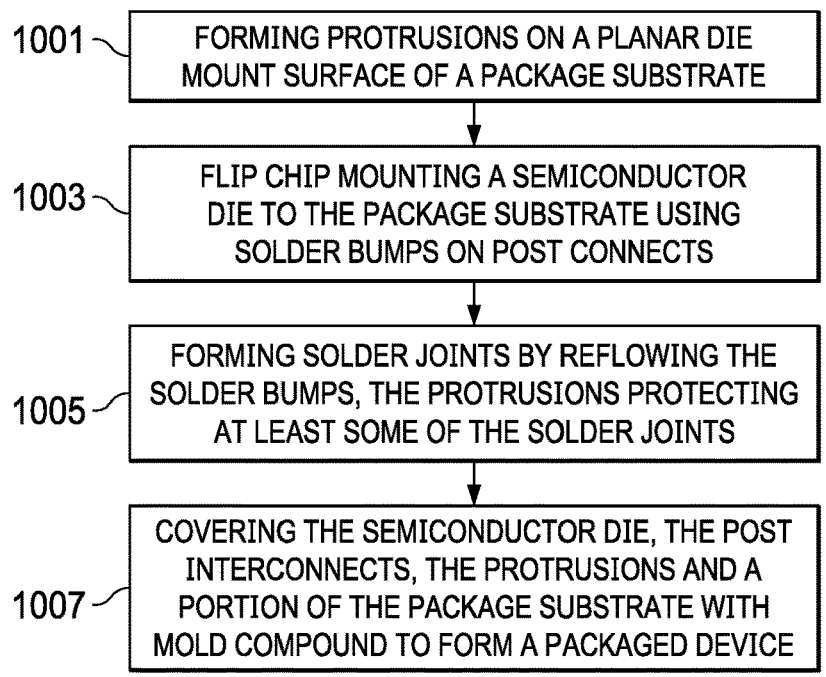
FIG. 10 is a flow diagram that illustrates another method.

FIG. 10 is a flow diagram that illustrates steps of another method. In FIG. 10, at step 1001, protrusions are formed on a planar die mount surface of a package substrate. The package substrate may be a MIS substrate, such as an RLF substrate, or other MIS substrate.

At step 1003, a semiconductor die having post connects with solder bumps on is flip chip mounted on the package substrate.

At step 1005, the solder joints are formed by melting the solder bumps to join the post connects to the planar surface of the package substrate, the solder joints being in a plane that is spaced from the surface of the protrusions.

At step 1007, the structure is covered with mold compound to form a packaged semiconductor device.

Modifications are possible in the described arrangements, and other alternative arrangements are possible within the scope of the claims.

What is claimed is:

1. An apparatus, comprising:
   a package substrate having a planar die mount surface;
   recesses extending into the planar die mount surface; and
   a semiconductor device die flip chip mounted to the package substrate on the planar die mount surface, the semiconductor device die having post connects having proximate ends on bond pads on an active surface of the semiconductor device die, and extending to distal ends away from the semiconductor device die having solder bumps, wherein the solder bumps form solder joints to the package substrate within the recesses, wherein the package substrate is a metal lead frame made entirely of metal.

2. The apparatus of claim 1, wherein the recesses have a rounded bottom.

3. The apparatus of claim 1, wherein the recesses have a flat bottom.

4. The apparatus of claim 1, and further comprising mold compound covering the semiconductor device die, the planar die mount surface of the package substrate, and surrounding the solder joints within the recesses.

5. The apparatus of claim 1, wherein the metal lead frame is one selected from copper, stainless steel, steel, and alloy 42.

6. The apparatus of claim 1, wherein the solder bumps further comprise solder selected from lead solder and lead-free solder.

7. The apparatus of claim 6, wherein the solder bumps further comprise lead-free solder that includes tin and silver.

8. The apparatus of claim 7, wherein the solder bumps further comprise lead-free solder that includes tin, silver and copper.

9. A method, comprising:
forming recesses, in a planar die mount surface of leads of a semiconductor package including a package substrate, in locations where solder joints will be formed, wherein the package substrate is a metal leadframe;
flip chip mounting a semiconductor device die to the package substrate using solder bumps on post connects, the post connects having a proximate end mounted on bond pads on an active surface of the semiconductor device die, and having a distal end extending away from the semiconductor device die, the solder bumps on the distal ends of the post connects;
forming solder joints between the solder bumps on the post connects and the package substrate within the recesses by a thermal reflow process to melt the solder bumps; and
covering the semiconductor device die, the solder joints, the post connects and a portion of the package substrate with mold compound.

10. The method of claim 9, wherein forming recesses further comprises etching the planar die mount surface of the package substrate.

11. The method of claim 9, wherein forming recesses further comprises laser drilling the planar die mount surface of the package substrate.

12. The method of claim 9, wherein forming recesses in a package substrate further comprises forming recesses in leads of a conductive lead frame.

* * * * *